United States Patent
Allman

(10) Patent No.: US 6,479,857 B1
(45) Date of Patent: Nov. 12, 2002

(54) CAPACITOR HAVING A TANTALUM LOWER ELECTRODE AND METHOD OF FORMING THE SAME

(75) Inventor: Derryl Allman, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/517,150

(22) Filed: Mar. 2, 2000

(51) Int. Cl.$^7$ ............................................... H01L 29/94
(52) U.S. Cl. ........................................ 257/310; 257/306
(58) Field of Search ................................. 257/306, 310, 257/315, 316, 309, 296

(56) References Cited

U.S. PATENT DOCUMENTS

| | | | |
|---|---|---|---|
| 3,781,610 A | * 12/1973 | Bodway | 317/101 |
| 5,049,958 A | * 9/1991 | Baglee | 357/23.6 |
| 5,142,438 A | * 8/1992 | Reinberg et al. | 361/313 |
| 5,348,894 A | * 9/1994 | Gnade et al. | 437/12 |
| 5,973,348 A | * 10/1999 | Ishibashi | 257/306 |
| 6,180,481 B1 | * 1/2001 | Deboer et al. | 438/396 |

FOREIGN PATENT DOCUMENTS

| JP | 361145854 A | * 7/1986 | ................. 257/310 |
|---|---|---|---|

* cited by examiner

*Primary Examiner*—Steven Loke
*Assistant Examiner*—Douglas W. Owens
(74) *Attorney, Agent, or Firm*—Trexler, Bushnell, Gangiorgi, Blackstone & Marr Ltd.

(57) ABSTRACT

A capacitor has a titanium nitride layer deposited on a silicon substrate for stress reduction and adherence promotion, and a layer of tantalum is deposited thereon. The tantalum layer is oxidized to produce a tantalum pentoxide layer. A top electrode of metal or polysilicon is then deposited on the tantalum pentoxide layer. The top electrode may be made from polysilicon or a similar semiconducting material so that a space charge layer will form in the electrode which will change the rate at which the capacitor charges and discharges. Alternatively, the top electrode may be made from metal to provide an optimal linear response for use in analog applications. Further, an undoped polysilicon layer may be provided above the tantalum pentoxide layer to store charge for non-volatile memory applications. For this purpose, polysilicon can be used to form the top electrode; alternatively, materials such as silicon nitride may be used.

6 Claims, 5 Drawing Sheets

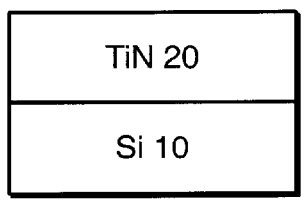
FIG._1
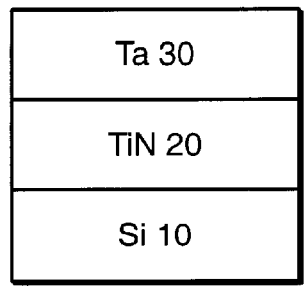
FIG._2
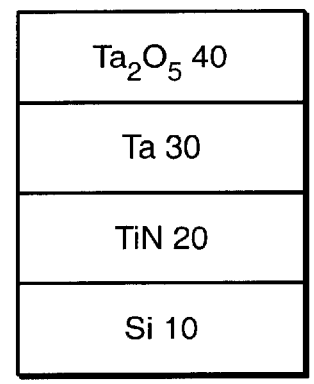
FIG._3
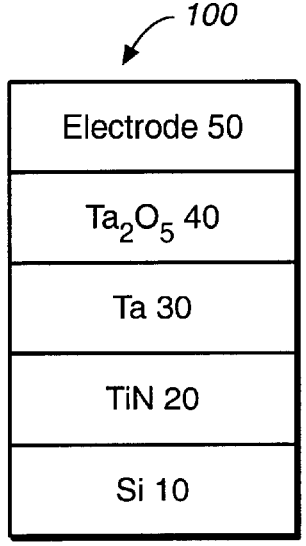
FIG._4
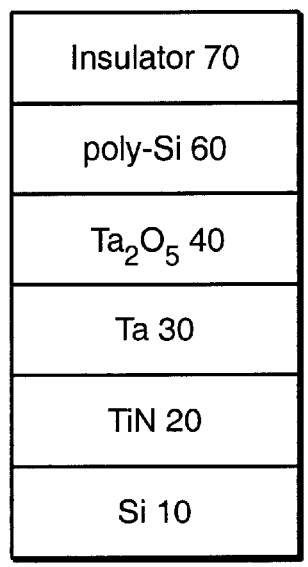
FIG._6
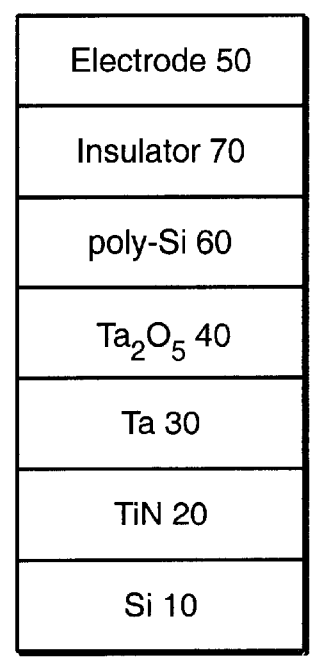
FIG._7

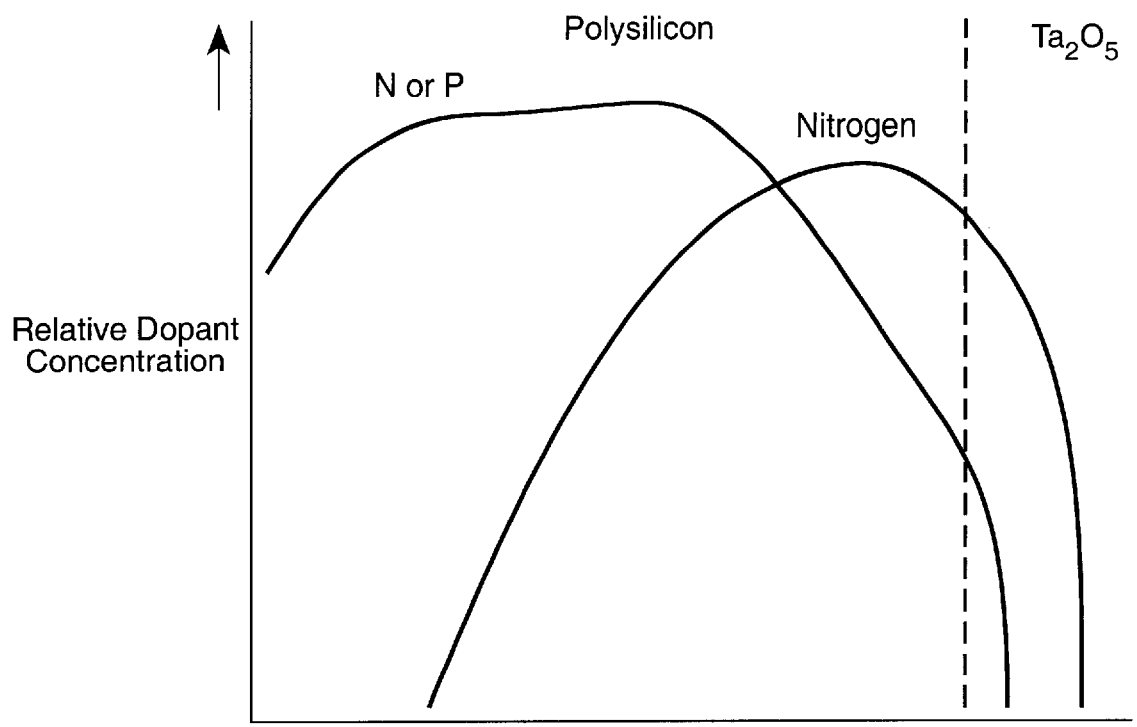
FIG._5
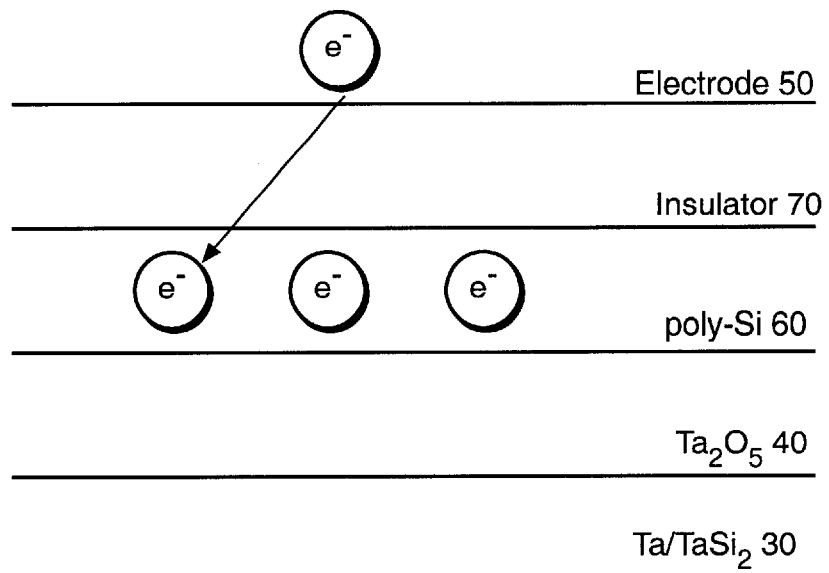
FIG._8

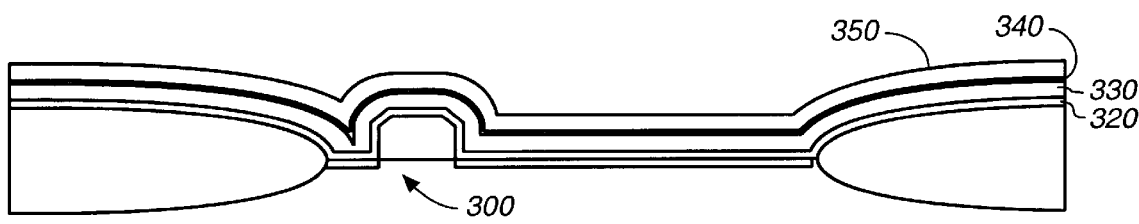
FIG._9A
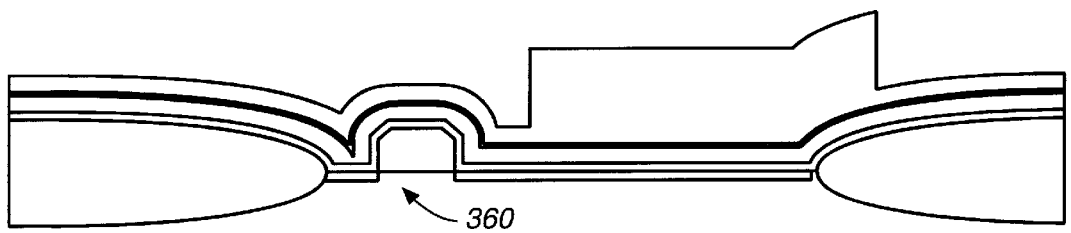
FIG._9B
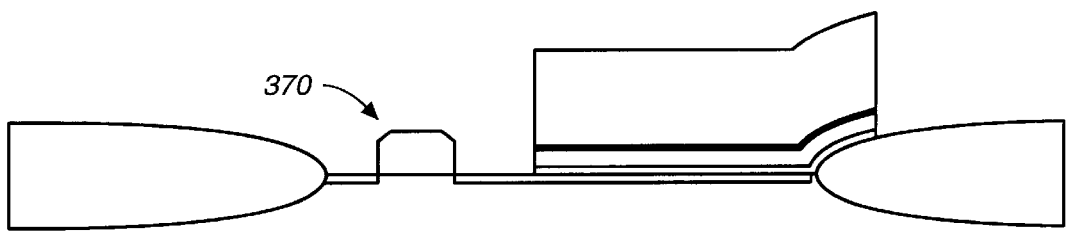
FIG._9C
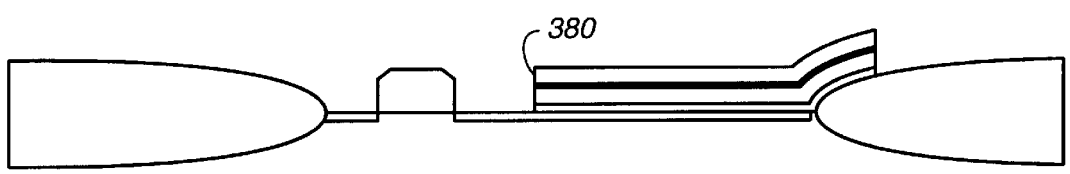
FIG._9D
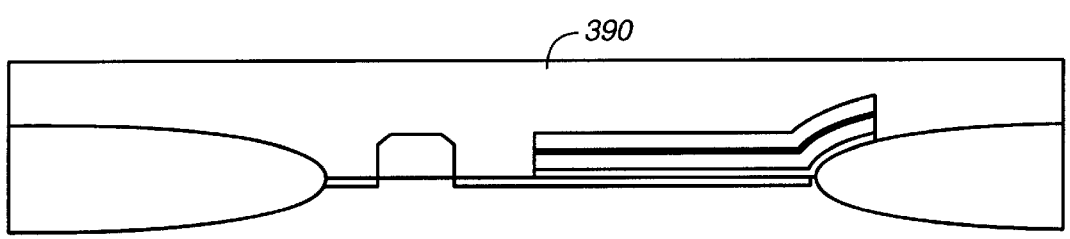
FIG._9E

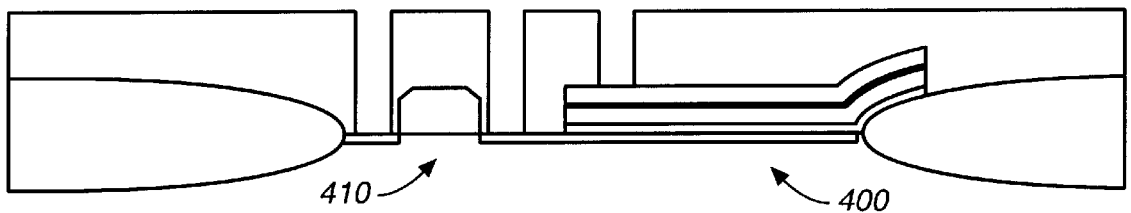
FIG._10A
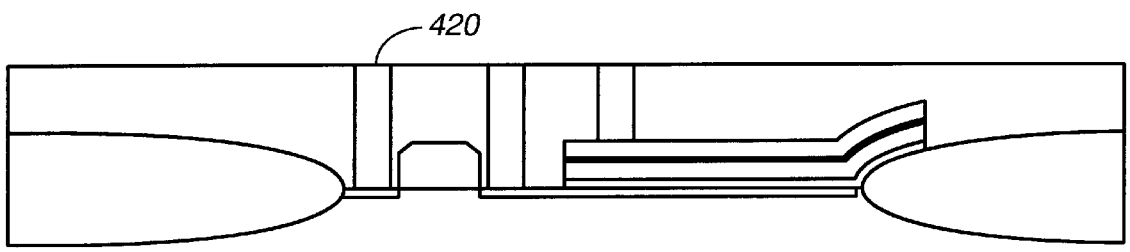
FIG._10B
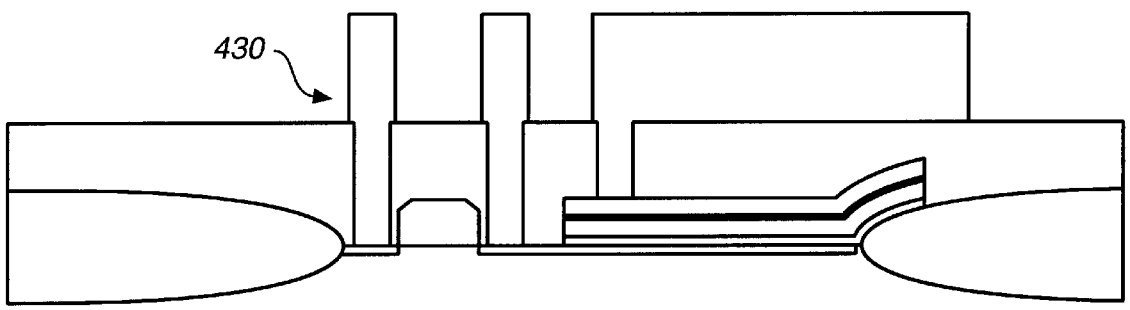
FIG._10C

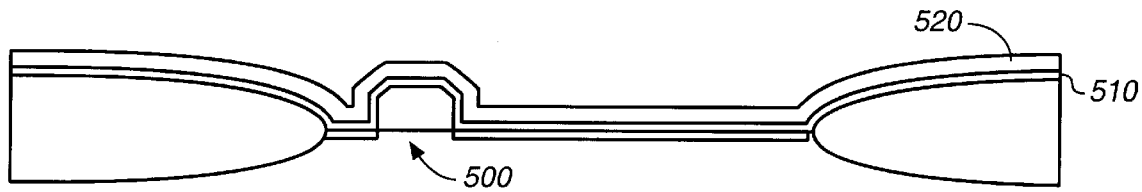
FIG._11A
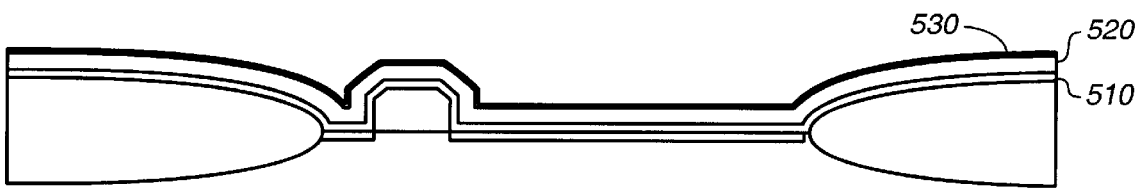
FIG._11B
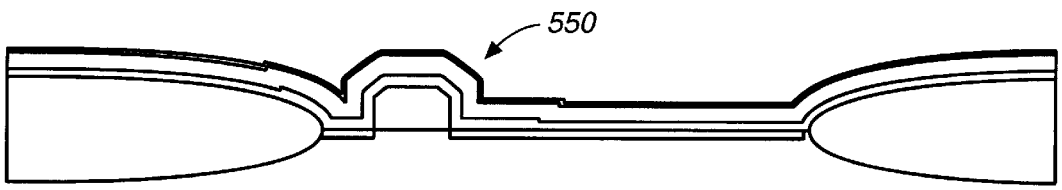
FIG._11C

CAPACITOR HAVING A TANTALUM LOWER ELECTRODE AND METHOD OF FORMING THE SAME

BACKGROUND OF THE INVENTION

1. Field of the Invention

The present invention relates to a capacitor having a tantalum lower electrode and a method of fabricating the same.

2. Background of the Related Art

Capacitors are found in numerous semiconductor devices. Despite the proliferation of various types of capacitors, large amounts of effort are still expended in attempts to obtain capacitors that have particular electrical characteristics and can also be easily fabricated using modern semiconductor fabrication technologies.

One specific capacitor of this type that has been proposed is a capacitor that uses tantalum to form its lower electrode. For example, U.S. Pat. No. 5,142,438 describes such a capacitor. This lower electrode, through buried contacts, electrically connects to the word and bit lines of a semiconductor DRAM memory. The tantalum layer is thereafter subjected to a rapid thermal processing or furnace heating which creates a tantalum silicide layer at the tantalum layer's interface with the silicon substrate, and an insulating tantalum pentoxide dielectric layer at the top of the tantalum layer. After depositing a layer of barrier material such as silicon nitride, a polysilicon electrode layer is deposited on the structure and doped.

While the above-described approach allows for the creation of a dielectric layer over a conducting layer without specifically applying a distinct dielectric layer, the applications in which this device can be used are limited due to a number of considerations.

For example, when the capacitor is used in a DRAM as disclosed in the '438 patent, its charge storage need not be very great. Accordingly, the very thin tantalum pentoxide layer that is formed can be used. Consequently, a correspondingly thin deposited tantalum layer can be used to form the tantalum pentoxide layer. If, however, a thicker tantalum pentoxide layer was needed in order to allow for greater charge storage, a thicker original tantalum layer would be used. This cannot, however, be easily achieved, since thick tantalum layers are known to exhibit stress characteristics that lead to warpage of the wafer on which it is formed.

SUMMARY OF THE INVENTION

The present invention is made with the above-mentioned problems of the prior art in mind, and it is an object of the present invention to provide a capacitor which can be fabricated on a semiconductor substrate using semiconductor fabrication techniques to provide high capacitance while consuming reduced chip area.

It is a further object of the invention to provide such a capacitor which has switching characteristics variable according to parameters of the fabrication process.

It is yet another object of the invention to provide such a capacitor which can perform a non-volatile charge storage function.

The above objects are achieved by forming a capacitor in which, according to a first preferred embodiment of the invention, a titanium nitride layer is deposited on a silicon substrate for stress reduction and adherence promotion, and a layer of tantalum is deposited thereon. Then, the tantalum layer is oxidized using a furnace or RTA to produce a tantalum pentoxide layer. A top electrode of metal or polysilicon is then deposited on the tantalum pentoxide layer.

According to one aspect of the invention, the top electrode is made from polysilicon or a similar semiconducting material so that a space charge layer will form in the electrode which will change the rate at which the capacitor charges and discharges. Other fabrication parameters described in greater detail herein also affect the charging characteristics of the resultant capacitor.

According to another aspect of the invention, the top electrode is preferably made from metal to provide an optimal linear response for use in analog applications. An appropriate application for a capacitor designed in this way would be for tuning a receiver circuit or the like.

According to yet another aspect of the present invention, an undoped polysilicon layer above the tantalum pentoxide layer between the top and bottom electrodes stores charge for non-volatile memory applications. For this purpose, polysilicon can be used to form the top electrode; alternatively, materials such as silicon nitride may be used.

BRIEF DESCRIPTION OF THE DRAWINGS

These and other objects, features, and advantages of the present invention are better understood by reading the following detailed description of the preferred embodiments, taken in conjunction with the accompanying drawings, in which:

FIGS. 1–4 are cross-sectional diagrams of a semiconductor chip showing the steps in fabricating a capacitor according to a first preferred embodiment of the present invention;

FIG. 5 is a graph showing the effect of dopant levels in a polysilicon layer in the first preferred embodiment;

FIGS. 6 and 7 are cross-sectional diagrams of a semiconductor chip showing the additional steps in fabricating a capacitor according to a second preferred embodiment of the present invention;

FIG. 8 is a diagram showing a tunneling effect according to preferred embodiments of the present invention;

FIGS. 9A–9E show an embodiment of the present invention used as a standalone unit next to a transistor;

FIGS. 10A–10C show an embodiment of the present invention used in conjunction with a transistor; and FIGS. 11A–11C show an embodiment of the present invention in which an oxide blocking mask is used to prevent interaction of TiN with silicon.

DETAILED DESCRIPTION OF THE PRESENTLY PREFERRED EXEMPLARY EMBODIMENT

To form a capacitor 100 according to a first preferred aspect of the present invention, a titanium nitride layer 20 to provide stress reduction and promote adherence of the layer above it for the resultant capacitor 100 is deposited, preferably to a thickness of at least 50 Å but possibly greater than 1 $\mu$m) on a silicon substrate 10 as shown in FIG. 1.

The silicon substrate is preferably doped with N or P type dopant. This doped region may extend out from under the capacitor and be connected to other transistors or resistors.

Further, the titanium nitride layer 20 provides stress relief as follows. The stoichiometry (Ti-to-N ratio) of the layer 20 controls the density or atomic bonding distance of the titanium nitride layer 20 and its strength. When titanium nitride is in contact with silicon and heat is applied, there is an interaction of the titanium nitride layer 20 with the silicon substrate 10 where the titanium nitride bond breaks, releasing nitrogen, and the titanium combines with the silicon.

Since stress in a film is due to the change in the atomic bonding distance between its components, when two different materials with different atomic bonding distances are interposed, the resultant intermixing of the two films results in either a contraction or expansion of this distance. The thickness and strength of one material compared to another determines the extent to which each material will deform. So, controlling the thickness of the titanium nitride layer 20 relative to the tantalum layer 30 and the density of the titanium nitride layer 20 will control the resultant stress of the titanium nitride/tantalum films 20 and 30 relative to the silicon substrate 10.

The titanium nitride layer 20 is preferably deposited using physical vapor deposition (PVD) at a temperature anywhere from room temperature to 500° C. Also, this titanium nitride layer 20 may be deposited using techniques to control the direction of the incoming ions by IMP (inductively coupled plasma) or long throw (long distance from target to wafer surface) to control orientation of the titanium nitride film (a<111>orientation is preferred) for a dense titanium nitride layer 20. The preferred temperature of titanium nitride deposition is 150° C. using IMP for about 10 seconds.

Next, as shown in FIG. 2 a layer of tantalum 30 is deposited on the tantalum nitride layer 20, preferably to a thickness of at least 50 Å but possibly greater than 1 μm. Then, the tantalum layer 30 is oxidized using a furnace or rapid thermal oxidation to grow a tantalum pentoxide layer 40, preferably to a thickness of 20–5000 Å as shown in FIG. 3.

The rapid thermal oxidation can be done at a temperature between 600° C. to 1000° C., but preferably is performed at 800° C. in an ambient oxygen atmosphere. After the growth of the tantalum pentoxide layer 40, it can be densified in a nitrogen (or an inert gas) ambient at about 900° C., or more preferably 960° C. The thickness of the tantalum pentoxide layer 40 depends on the capacitor characteristics needed, as will be readily apparent to those skilled in the art.

The thickness of the tantalum pentoxide layer 40 is controlled by the size of the capacitor. Tantalum pentoxide has a dielectric constant that is four times higher than silicon dioxide, which means (compared to silicon dioxide) the area of the layer 40 can shrink or the dielectric thickness can increase by four times. In order to make use of the fourfold increase in dielectric constant of tantalum pentoxide over silicon dioxide, an equivalent tantalum pentoxide layer 40 gate thickness of 200 Å is preferred.

A top electrode 50 of metal or polysilicon is then deposited as shown in FIG. 4. With this structure, the top electrode 50 and tantalum layer 30 serve as electrodes for connecting the capacitor 100 to other circuitry on the semiconductor chip, i.e., word and bit lines, etc.

The top electrode 50 can be deposited using PVD or CVD techniques. The temperature of the deposition should be in the range of room temperature to 600° C. The preferred embodiment uses titanium nitride PVD at 200° C.

Thus, in the above manner, although not requiring a separate process step for its deposition, the tantalum pentoxide layer 40 serves a high-level, high-quality dielectric layer, and the titanium nitride layer 20 relieves stress induced by the fabrication of the layers above it.

The top electrode 50 can be a metal such as tantalum, a semiconductor material such as polysilicon, or a combination of the two. The composition of the top electrode 50 influences the linearity and switching speed of the capacitor 100 in both analog and memory applications.

For example, if polysilicon and tantalum were used for the top electrode 50, polysilicon's resistance would control the timing delay targeting information in and out of the circuit in which the capacitor 100 is employed. If the current from the capacitor 100 passed through the polysilicon, then the combination of the polysilicon resistance with the rate at which the space charge layer within it collapsed would control the timing delay ($\tau \approx RC$) of the circuit. The tantalum layer 30 above the electrode layer 50 would be another barrier during the contact etch. Polysilicon could be used for only the top electrode 50 since the lower tantalum electrode 40 is being oxidized to produce tantalum pentoxide for the capacitor's dielectric. The dielectric constant of the capacitor would be a combination of those of both the tantalum pentoxide and polysilicon.

If the top electrode 50 is made from polysilicon or a similar semiconducting material, then as noted above a space charge layer will form in the electrode 50, which will change the rate at which the capacitor 100 charges and discharges. Further, the resistance of the polysilicon is controlled by its dopant concentration, film thickness and grain structure, all of which will have an influence on R in the $\tau = RC$ timing delay. The doping concentration would offer the most precise control of the resistance of the polysilicon line. The doping of the electrode 50, its dopant profile, concentration and polysilicon grain structure will influence the depth of the space charge layer and the capacitor's electrical response characteristics.

The direction in which the capacitor 100 is biased (generally, a positive potential would be applied to the polysilicon or electrode side of the capacitor) will also have a major influence on the space charge layer formed in the electrode layer 50 and the capacitor 100 response characteristics, meaning it will take a longer time for the capacitor 100 to charge and discharge in a bias direction of one polarity compared to the bias direction of the opposite polarity. This effect is dependent on frequency, which is associated with the mobility difference of the electrons or holes in the thickness of the space charge region in the semiconductor, as well as the dopant type in the polysilicon (P or N). So, the linearity of the capacitance, i.e., dC/dV—the change in capacitance relative to voltage, can be tailored by appropriate design of the capacitor 100.

A capacitor 100 designed in this way would act like two capacitors in series with a resistor, thereby forming an RC timing circuit. More specifically, the dC/dV characteristic is controlled by the capacitance of the space charge region in the electrode layer 50 which is controlled by the dopant concentration. The effective circuit consists of a resistor (formed by series resistances of the polysilicon and tantalum in the electrode layer 50) which can be controlled by dopant level therein, in series with two series-connected capacitors (one being formed from a space charge region in the electrode layer 50 and the other from the tantalum pentoxide dielectric layer 40). Additional series resistances are formed by the tantalum layer 30 and the titanium nitride or $TiSi_2$ layer 20. So, changing the dopant levels, dopant profiles and activation level in the electrode layer 50 controls the polysilicon resistor and space charge capacitance.

As shown in the graph of FIG. 5, using N or P type dopants along with nitrogen can independently control these values. Nitrogen does not diffuse as quickly in the polysilicon and interferes with the incorporation of the N or P type dopant into the polycrystalline structure. Therefore, nitrogen would control the resistance locally at that interface where the space charge region is formed. If nitrogen is not used then just controlling the dopant level and concentration of P or N type dopants would have the same effect.

When the capacitor 100 is used in analog applications, both electrodes need to be metal to eliminate the space charge layer, which improves switching speed, linearity—change in capacitance vs. voltage should be as constant, flat, as possible over the entire voltage range—and the tantalum pentoxide free of fixed charge to get the best linear response, i.e., no change in capacitance relative to voltage. An appropriate application for a capacitor 100 designed in this way would be for tuning a receiver circuit or the like.

According to a second preferred embodiment of the present invention as shown in FIGS. 6 and 7, it is possible to include an undoped polysilicon layer 60 above the tantalum pentoxide layer 40 between the top and bottom electrodes 20 and 50 as shown in FIGS. 6 and 7 and then deposit an insulating layer 70 of, e.g., silicon dioxide, on it (see FIG. 7) before depositing the top electrode 50, thereby forming a capacitor 200 which stores charge for non-volatile memory applications.

In this embodiment, electrodes either tunnel through the tantalum pentoxide layer 40 or insulator layer 70 to deposit and trap changes in the polysilicon layer 60, which could alternatively be $Si_3N_4$ or a doped polysilicon layer. Metal electrodes, polysilicon, silicide or a combination of electrodes can be used. When voltage is applied in one direction, tunneling occurs to charge the polysilicon; when the voltage is off, then the quality of the oxide (leakage characteristics) controls the discharge rate. The tunneling dielectric has to be thin and of high quality, so silicon dioxide is preferred.

For this purpose, undoped polysilicon can be deposited on the tantalum pentoxide layer 40; alternatively, materials such as silicon nitride may be used. If polysilicon is used, it can be oxidized to form a high quality oxide above to be in contact with the top electrode. For $Si_3N_4$ this oxide has to be deposited, then annealed.

For non-volatile memory applications, the necessary thickness of the tantalum pentoxide layer 40 is related to the operating voltage of the chip, and determines the voltage at which tunneling current would occur in the capacitor 200. This is because Fowler-Nordheim tunneling current occurs before avalanche breakdown of the dielectric as shown in FIG. 8. Therefore, the thickness needs to be precisely controlled to a range of +/−5% or 5 Å.

For a non-volatile memory application, electrons tunnel through the tantalum pentoxide layer 40 and are trapped in the undoped polysilicon or silicon nitride layer 60 to establish non-volatile charge storage. To dissipate the stored charge, the bias of capacitor 200 is reversed.

More specifically, after forming the tantalum layer 30 and tantalum pentoxide layer 40 as described above, he polysilicon is deposited at 510° C.–680° C. (preferably 620° C.) to a thickness of 5 Å to 3000 Å (preferably 100 Å). The oxide is preferably deposited by a high temperature, low pressure HTO process (reduction of $SiH_4$ with $O_2$ in a CVD tube) to deposit a 10 Å to 100 Å (preferably 60 Å) oxide for a-5V process (or preferably 40 Å for a 3.3 V process). This oxide could also be deposited by a PECVD or HDP process using the same source gases.

The oxide is annealed in a furnace in nitrogen at 900–1080° C. (preferably 950° C.) for 5 minutes to 4 hours (preferably 20 minutes). The preferred method is to deposit a thicker polysilicon film, then oxidize it at 850–1050° C.

(preferably 900° C.) in a $O_2$ ambient. This oxide would be grown to the same tunneling thickness as stated before. The operation consists of biasing the entire stack such that the voltage drop across the tunneling dielectric reaches an E field level where Fowler-Nordheim tunneling would occur. Most of the voltage drop across the stack will occur across the $SiO_2$ film.

A single nonvolatile cell consists of stacked layers and the cells are in parallel. Thus, the use of a higher k oxide is needed to reduce the size of these capacitor elements. Accordingly, oxides such as $Ta_2O_5$ are preferred.

FIGS. 9A–9E show an embodiment of the present invention used as a standalone capacitor 300. In FIG. 9A, the TiN 320 and Ta 330 have been deposited and RTP of the Ta 330 has been completed to form $Ta_2O_5$ 340. Additionally, the deposition of the top electrode 350 material has been completed. In FIG. 9B, the capacitor 360 has been defined using photolithograhpic techniques. In FIG. 9C, the structure 370 has been etched to remove the capacitor layers. Here, the transistor layer could be blocked from TiN reaction with exposed silicon by an oxide hard mask requiring separate deposition and photolithography (not shown). FIG. 9D shows the addition of a photoresist strip 380, and FIG. 9E shows the deposition of oxide 390 and planarization of the oxide face using CMP.

FIGS. 10A–10C show another embodiment of a capacitor-transistor design where the transistor 400 may be used to charge the capacitor 410. Here, starting with the structure of FIG. 10A, FIG. 10B shows the structure after tungsten plug fill 420 and polish, and FIG. 10C shows the resultant structure 430 after metal deposition, photolithography and etching.

Finally, FIGS. 11A–11B show another embodiment of the present invention employing an oxide blocking mask preventing interaction of the TiN with the silicon surface. Here FIG. 11A shows the structure 500 after deposition of TiN 510 and Ta 520 films. FIG. 11B shows the resultant structure after RTP oxidation of the Ta 520 layer to form $Ta_2O_5$ 530. Implant activation may also be performed here. Finally, FIG. 11C shows the formation of the blocking mask 550.

The present invention has been described above in connection with a preferred embodiment thereof; however, this has been done for purposes of illustration only, and the invention is not so limited. Indeed, variations of the invention will be readily apparent to those skilled in the art and also fall within the scope of the invention.

What is claimed is:

1. A semiconductor device comprising:

a semiconductor substrate;

a tantalum layer disposed on a first side of the semiconductor substrate;

a tantalum pentoxide layer disposed on the tantalum layer;

a titanium nitride layer disposed between said semiconductor substrate and said tantalum layer for providing at least one of a stress reduction effect and an adherence effect to said semiconductor substrate and said tantalum layer;

a polycrystalline silicon electrode layer disposed onto a side of the tantalum pentoxide layer opposite the semiconductor substrate; and a nitrogen doping at an interface between the tantalum pentoxide layer and the polycrystalline silicon layer to control the resistance of a space charge layer formed therein when the device is operational.

2. A semiconductor device comprising:

a semiconductor substrate;

a tantalum layer disposed on a first side of the semiconductor substrate;

a tantalum pentoxide layer disposed on the tantalum layer;

an electrode layer disposed on a side of the tantalum pentoxide layer opposite the semiconductor substrate;

a titanium nitride layer disposed between said semiconductor substrate and said tantalum layer for providing at least one of a stress reduction effect and an adherence effect to said semiconductor substrate and said tantalum layer;

a semiconductor layer disposed between the tantalum pentoxide layer and the electrode layer; and an insulating layer disposed between the semiconductor layer and the electrode layer.

3. The device of claim 2, wherein:

the semiconductor layer is capable of performing non-volatile charge storage; and the insulating layer insulates the semiconductor layer from the electrode layer.

4. The device of claim 2, wherein the insulating layer is silicon nitride.

5. The device of claim 2, wherein the semiconductor layer is polycrystalline silicon.

6. The device of claim 5, further comprising a nitrogen doping at an interface between the tantalum pentoxide layer and the polycrystalline silicon layer to control the resistance of a space charge layer formed therein when the device is operational.

* * * * *